(12) United States Patent
Lin

(10) Patent No.: US 7,755,120 B2
(45) Date of Patent: Jul. 13, 2010

(54) SEMICONDUCTOR DEVICE

(75) Inventor: Chin-Min Lin, Taiping (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 611 days.

(21) Appl. No.: 11/625,353

(22) Filed: Jan. 22, 2007

(65) Prior Publication Data

US 2008/0173966 A1 Jul. 24, 2008

(51) Int. Cl.
*H01L 31/224* (2006.01)

(52) U.S. Cl. ............... 257/292; 257/294; 257/E27.133; 257/E27.134

(58) Field of Classification Search ........... 257/291, 257/292, 294, E27.132, E27.133, E27.134
See application file for complete search history.

(56) References Cited

U.S. PATENT DOCUMENTS

| 6,369,417 | B1 | 4/2002 | Lee |
| 6,964,916 | B2 * | 11/2005 | Kuo et al. ............ 438/462 |
| 7,537,951 | B2 | 5/2009 | Gambino et al. |
| 2006/0011813 | A1 * | 1/2006 | Park et al. ........... 250/208.1 |
| 2006/0148122 | A1 * | 7/2006 | Han ..................... 438/69 |
| 2008/0105944 | A1 * | 5/2008 | Chang et al. ......... 257/461 |
| 2008/0111159 | A1 * | 5/2008 | Gambino et al. ..... 257/225 |

FOREIGN PATENT DOCUMENTS

CN 101183671 A 5/2008

OTHER PUBLICATIONS

Chinese Office Action dated Jul. 24, 2009.
CN Office Action mailed May 31, 2010.
English abstract of CN101183671, pub. May 21, 2008.

* cited by examiner

*Primary Examiner*—Minh-Loan T Tran
(74) *Attorney, Agent, or Firm*—Thomas, Kayden, Horstemeyer & Risley

(57) ABSTRACT

A semiconductor device is disclosed. The semiconductor device provides a substrate comprising an image sensor region and a circuit region, wherein the circuit region comprises a pad region and a connecting region. A multilayer interconnect structure is formed on the substrate, wherein the multilayer interconnect structure comprises a plurality of dielectric layers, a plurality of lower wirings at the pad region and the connecting region, and a top wiring on at least one of the lower wirings at the connecting region. A passivation layer is formed over the multilayer interconnect structure. A pad structure is formed through the passivation layer and at least one of the dielectric layers on and electrically connected to at least one of the lower wirings at the pad region.

17 Claims, 10 Drawing Sheets

SEMICONDUCTOR DEVICE

BACKGROUND OF THE INVENTION

1. Field of the Invention

The invention relates to a semiconductor device, and more particularly to a pad structure of an image sensor device.

2. Description of the Related Art

A complementary metal-oxide-silicon (CMOS) image sensor is a device for converting optical images into electrical signals. The CMOS image sensor uses MOS transistors as switching devices for sequential transfer of electrical signals. A CMOS image sensor has certain advantages over a charge coupled device (CCD) image sensor. CMOS image sensors, for example, have lower manufacturing costs less consume less power than CCD image sensors. CCD image sensors are also more difficult to fabricate than CMOS image sensors. Moreover, random access is not possible with CCD image sensors, but is possible with CMOS image sensors. CMOS fabrication techniques have been under continuous development since the 1990's and signal-processing algorithms have also been continuously developed, yielding improved CMOS image sensors.

FIG. 1 is a cross sectional view of a conventional CMOS image sensor disclosed in U.S. Pat. No. 6,964,916 B2. The CMOS image sensor has a post-passivation pad portion 224 on the top of a bond pad 222, forming a bond pad structure (including bond pad 222 and portion 224) having a height greater than the height of the bond pad, and having a step height less than that of the bond pad. The post-passivation pad portion 224 is slightly higher than a top of a planarization layer 204a. The conventional CMOS image sensor has a planar topography, but the stack height of the conventional CMOS image sensor is still too high. FIG. 1b is a cross sectional view of another conventional CMOS image sensor disclosed in U.S. Pat. No. 6,369,417 B1. The pad open portion 310 formation is carried out after forming the color filter 305, the planarized photoresist 306 and the micro-lens 307, it is possible to prevent the surface of the metal line 301 form being damaged or contaminated. The pad open portion 310 of the conventional CMOS image sensor is electrically connected to the top metal 301, and the stack height of the conventional CMOS image sensor must still be reduced.

If the stack height of the CMOS image sensor is too high, sensitivity of the sensor may be affected, resulting in more material absorbing light intensity under a light pass. Also, higher stack height results in problematic cross talk due to increased light diffraction.

Thus, a CMOS image sensor with lower stack height is desirable.

BRIEF SUMMARY OF INVENTION

A detailed description is given in the following embodiments with reference to the accompanying drawings.

Semiconductor devices with lower stack height are provided. An exemplary embodiment of a semiconductor device comprises: a substrate comprising an image sensor region and a circuit region, wherein the circuit region comprises a pad region and a connecting region; a multilayer interconnect structure formed on the substrate, wherein the multilayer interconnect structure comprises a plurality of dielectric layers, a plurality of lower wirings at the pad region and the connecting region, and a top wiring on at least one of the lower wirings at the connecting region; a passivation layer formed over the multilayer interconnect structure; and a pad structure formed through the passivation layer and at least one of the dielectric layers on and electrically connected to at least one of the lower wirings at the pad region.

Another exemplary embodiment of a semiconductor device comprises: a substrate comprises an image sensor formed thereon; a multilayer interconnect structure formed on the substrate, wherein the multilayer interconnect structure comprises a plurality of lower wirings and a top wiring; a passivation layer formed over the multilayer interconnect structure; and a pad structure formed through the passivation layer, wherein a bottom of the pad layer is lower than the top wiring.

Another exemplary embodiment of a semiconductor device comprises: a substrate comprises an image sensor formed thereon; a multilayer interconnect structure formed on the substrate; a passivation layer formed over the multilayer interconnect structure; and a pad structure formed through the passivation layer, wherein a surface of the pad layer is not extended to the passivation layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
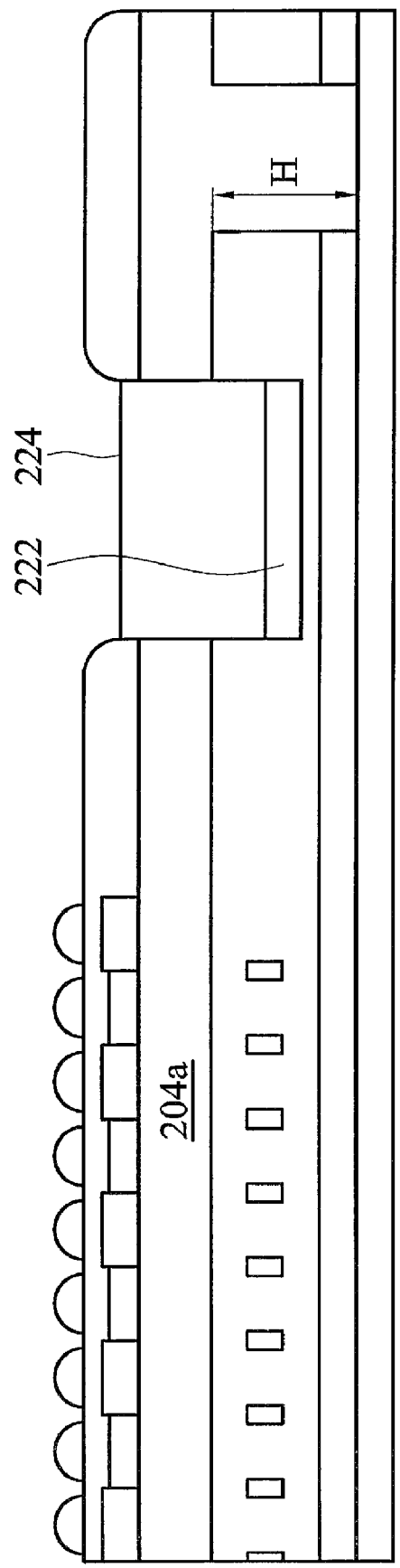
FIG. 1a is a cross section showing a conventional CMOS image sensor.
Figure 1B:
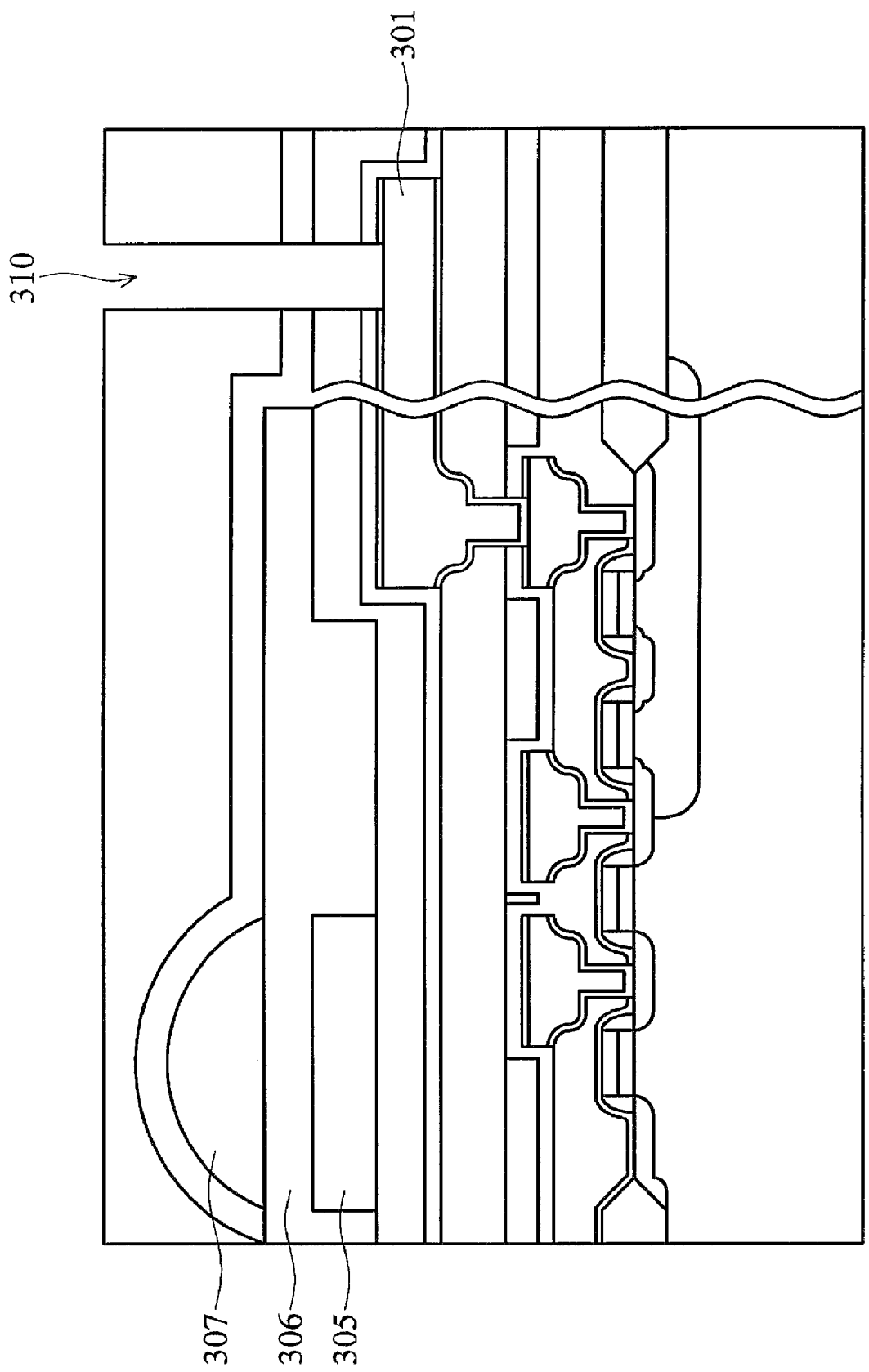
FIG. 1b is a cross section showing another conventional CMOS image sensor.
Figure 2:
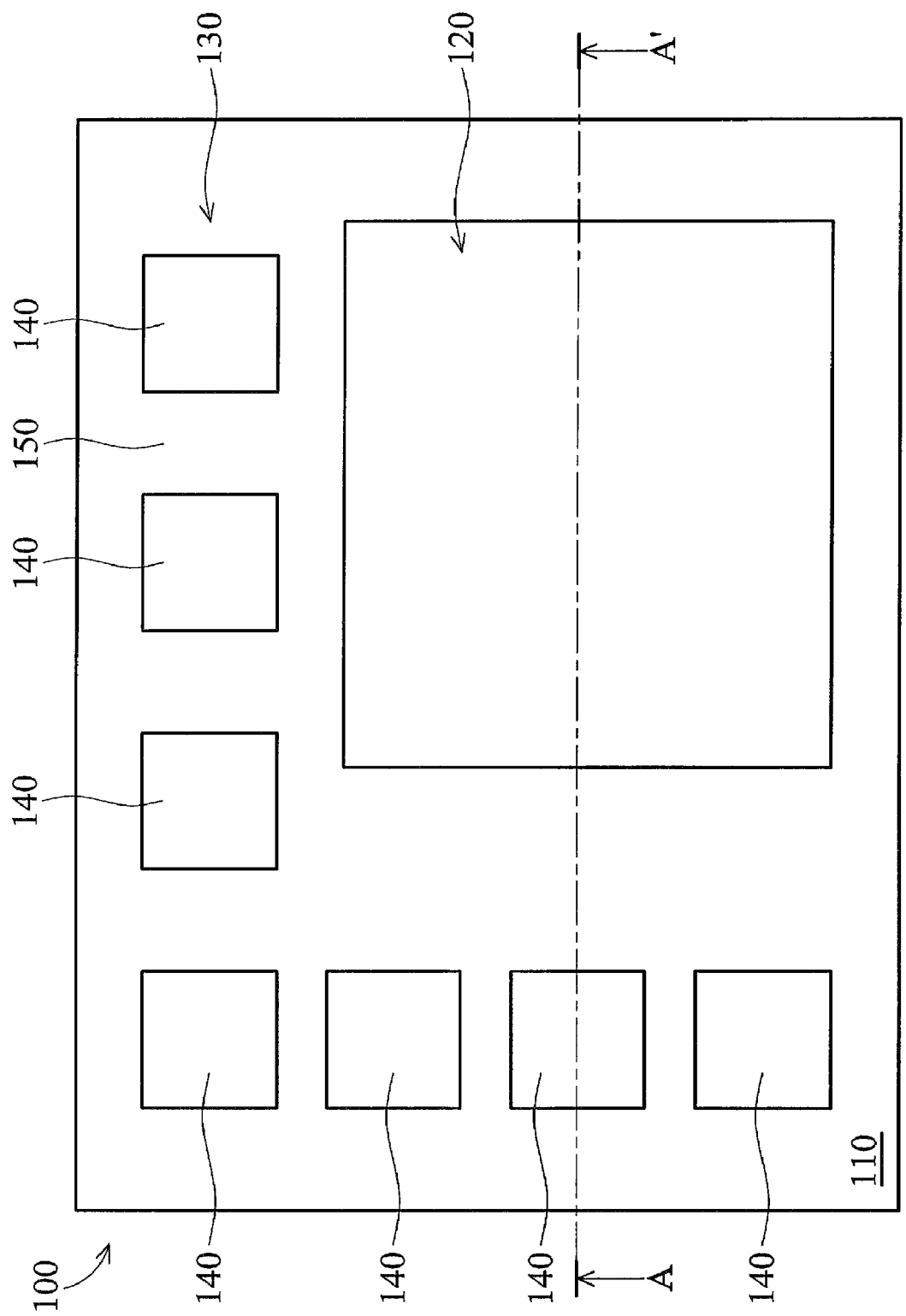
FIG. 2 is a top view showing an exemplary embodiment of a pad structure for a semiconductor device.

FIG. 2 is a top view showing an exemplary semiconductor device 100 of the invention. The semiconductor device 100 may comprise an image sensor device. A substrate 110 comprises an image sensor region 120 and a circuit region 130. The circuit region 130 provides external wirings for image devices in the image sensor region 120, wherein the circuit region 130 comprising a pad region 140 and a connecting region 150.

Figure 3:
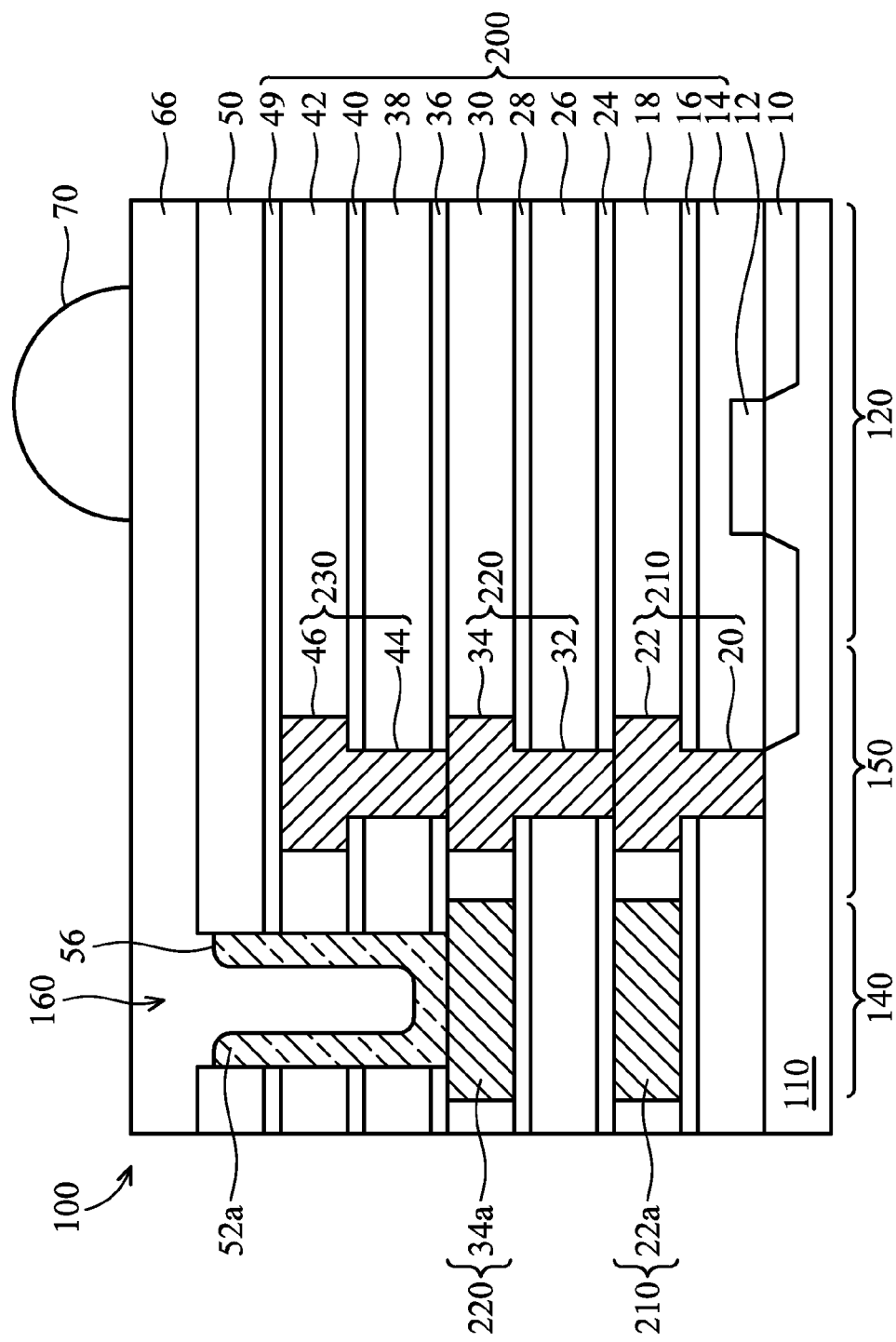
FIG. 3 is a cross section along the A-A' line of FIG. 2 showing an exemplary embodiment of a pad structure of a semiconductor device.

FIG. 3 is a cross sectional view along the A-A' line of FIG. 2 showing a pad structure 160 for a semiconductor device 100. The semiconductor device 100 comprises the substrate 110. The substrate 110 comprises the image sensor region 120 and the circuit region 130, wherein the circuit region 130 comprises the pad region 140 and the connecting region 150. A multilayer interconnect structure 200 is formed on the substrate 110, wherein the multilayer interconnect structure 200 comprises dielectric layers comprising insulating layers 14, 18, 26, 30, 38, and 42, and stop layers 16, 24, 28, 36, 40 and 49. The multilayer interconnect structure 200 also comprises a top wiring 230 and lower wirings 210 and 220. The lower wiring 210 comprises a tungsten-plug (W-plug) 20 and first metal trenches 22 and 22a; the lower wiring 220 comprises a via 32 and second metal trenches 34 and 34a; the top wiring 230 comprises a via 44 and a third metal trench 46. The lower wirings 210 and 220 are formed at the pad region 140 and the connecting region 150. The top wiring 230 is formed on the lower wiring 220 at the connecting region 150. A passivation layer 50 is formed over the multilayer interconnect structure 200. A pad structure 160 is formed through the passivation layer 50, the insulating layers 50, 42, 38, and the stop layers 49, 40, 36. The pad structure 160 is electrically connected to the second metal trench 34a at the pad region 140.

Figure 4A:
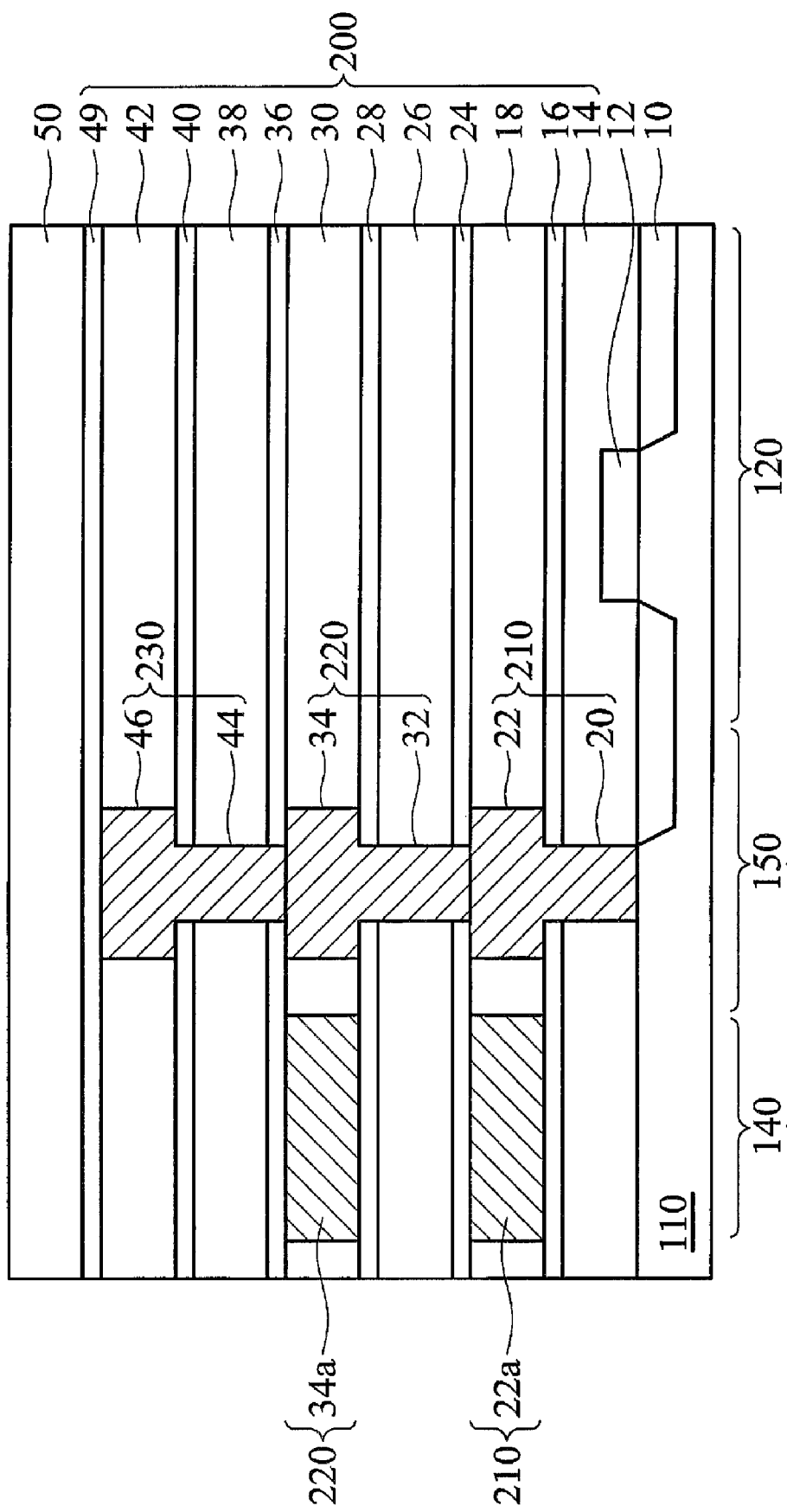
FIGS. 4a to 4f are cross sections along the A-A' line of FIG. 2 showing an exemplary embodiment of a process for forming a pad structure of a semiconductor device.

FIGS. 4a to 4g are cross sections along the A-A' line of FIG. 2 showing an exemplary embodiment of a process for forming the pad structure 160 of the semiconductor device 100. Referring to FIG. 4a, the substrate 110 comprising the image sensor region 120 and the circuit region 130, wherein the circuit region 130 comprises the pad region 140 and the connecting region 150. An image sensor 12 and shallow trench isolation (STI) 10 are formed at the image sensor region 120. Next, the multilayer interconnect structure 200 is formed on the substrate 110. Preferably the multilayer interconnect structure 200 comprises: a plurality of insulating layers 14, 18, 26, 30, 38, and 42; a plurality of stop layers 16, 24, 28, 36, 40 and 49; a plurality of lower wirings 210 and 220 at the pad region 140 and the connecting region 150 over the substrate 110; the top wiring 230 on at least one of the lower wirings 210 and 220 at the connecting region 150 and the pad region 140. And the passivation layer 50 is then formed over the stop layer 49. In embodiments, the number of insulating layers; the stop layers and the lower wirings are not limited and depend only on the design.

The lower wirings 210, 220 and the top wiring 230 may comprise composite structures with the W-plug 20, the vias 32 and 44, and the metal trenches 22, 22a, 34, 34a and 46. The lower wirings 210, 220 and the top wiring 230 are formed by sequential deposition of a barrier layer, a seed layer and a conductive layer in sequence. Next, a planarization process, such as chemical mechanical polishing (CMP), is used to remove the unnecessary conductive layer for surface smoothing. The barrier layer may comprise Ta or TaN by ionized metal plasma physical vapor deposition (IMP). The barrier layer can serve as an adhesion layer between the insulating layer and the conductive layer. The barrier layer can also serve as a diffusion barrier to prevent diffusion from the subsequently formed conductive layer. The seed layer is then formed on the barrier layer for the subsequently formed conductive layer. The seed layer may comprise copper or an alloy thereof by chemical vapor deposition (CVD). The seed layer is a thin layer and has a thickness of about 500 Å to 1000 Å. Next, the conductive layer is formed on the seed layer. The conductive layer of lower wirings 210, and 220 and the top wiring 230 may comprise aluminum, copper, or an alloy thereof formed by electrical chemical deposition (ECD), for example. The dielectric layers comprise composite layers with insulating layers 14, 18, 26, 30, 38, and 42, and stop layers 16, 24, 28, 36, 40 and 49. The insulating layer 14, 18, 26, 30, 38, and 42 comprise a low-k material with a dielectric constant of less than 3.2, for example a polymer based dielectric or an inorganic material such as phosphorus silicate glass (PSG), fluorinated silicate glass (FSG) or undoped silicate glass (USG). The insulating layers 14, 18, 26, 30, 38, and 42 are formed a by chemical vapor deposition (CVD) process, such as low-pressure chemical vapor deposition (LPCVD). The insulating layers 14, 18, 26, 30, 38, and 42 have a thickness of about 1000 Å to 9000 Å. The stop layers 16, 24, 28, 36, 40 and 49 may comprise a silicon nitride layer and have a thickness of about 100 Å to 1000 Å. Next, a passivation layer 50 is formed over the multilayer interconnect structure 200 by a chemical vapor deposition (CVD) process, such as plasma enhanced chemical vapor deposition (PECVD), low pressure chemical vapor deposition (LPCVD), or high density plasma chemical vapor deposition (HDPCVD) while using a silicon-containing material, an oxygen-containing material, or nitride-containing material. Particularly, silicon oxide, silicon nitride, silicon oxynitride, titanium nitride, or photosensitive polyimide can be used as the passivation layer 50. The passivation layer 50 has a thickness of about 8000 Å to 12000 Å.

Figure 4B:
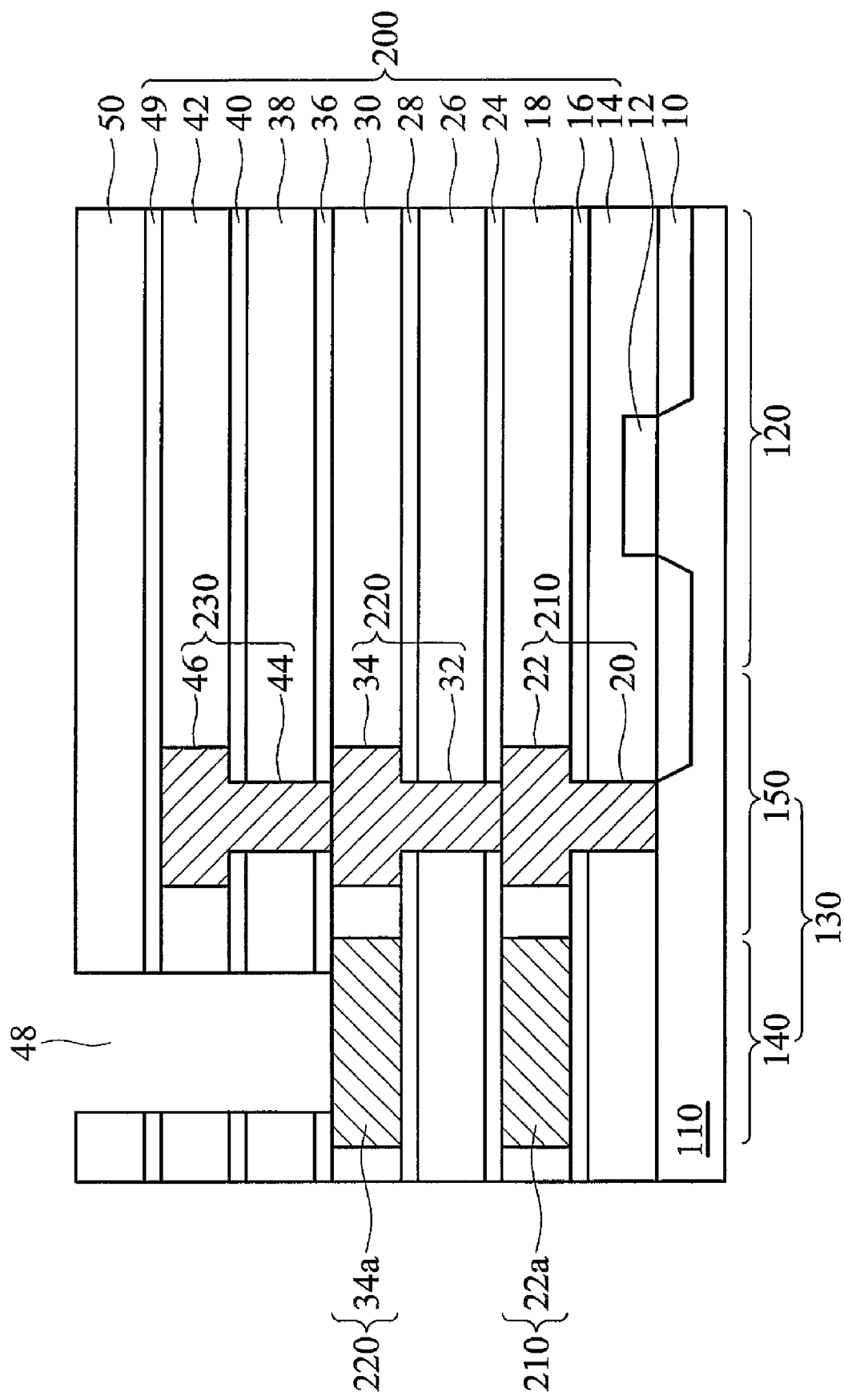

Referring to FIG. 4b, an opening 48 is then formed through the passivation layer 50, the stop layers 49, 40 and 36, and the insulating layers 42 and 38. The opening 48 is formed on the second metal trench 34a of the multilayer interconnect structure 200 at the pad region 140. The opening 48 is formed by selectively etching the passivation layer 50, the stop layers 49, 40 and 36, and the insulating layers 42 and 38. Preferably, the opening 48 is etched through the multilayer interconnect structure 200, and the second metal trench 34a of the lower wiring 220 is exposed through the opening 48 as shown in FIG. 4b. In some embodiments, any one of the lower wirings, not limited to the lower wirings 210 and 220, can be exposed through the opening 48 for subsequent bumping.

Figure 4C:
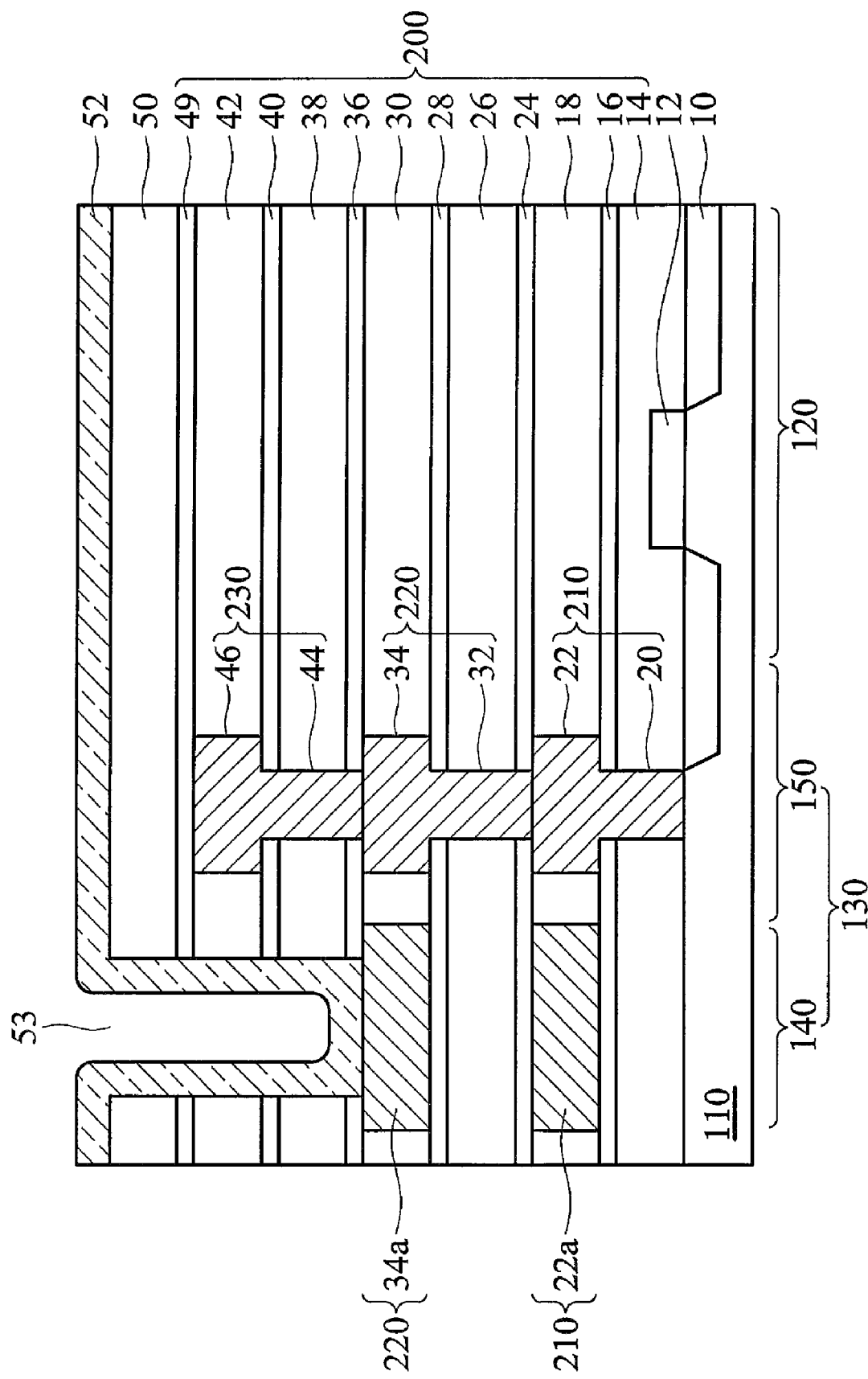

As shown in FIG. 4c, a pad layer 52 is conformally formed in the opening 48 with a recess 53 and extended to the passivation layer 50. The pad layer 52 may comprise composite layers with a TaN layer, AlCu, and a SiON layer, or a single layer with AlCu. The TaN layer serves as a diffusion barrier and adhesion layer for the AlCu layer and the second metal trench 34a. The AlCu layer serves as a bumping layer. The SiON layer serves as an antireflective coating (ARC). Preferably, the AlCu layer is formed by physical vapor deposition (PVD) such as sputtering deposition using a sputtering target made of aluminum, copper or the alloy thereof. And the AlCu layer has a thickness of about 11000 Å to 13000 Å.

Figure 4D:
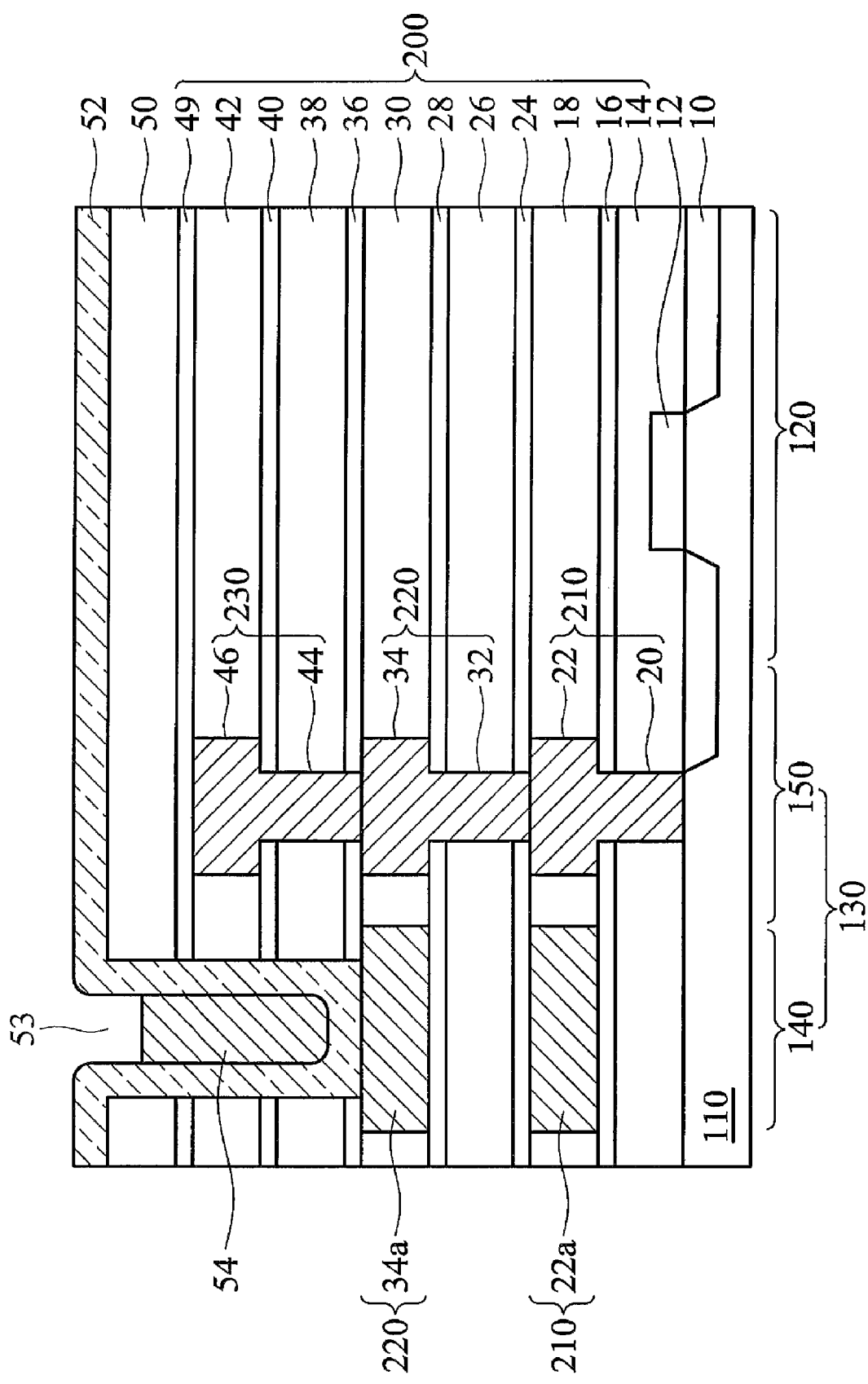
Figure 4E:
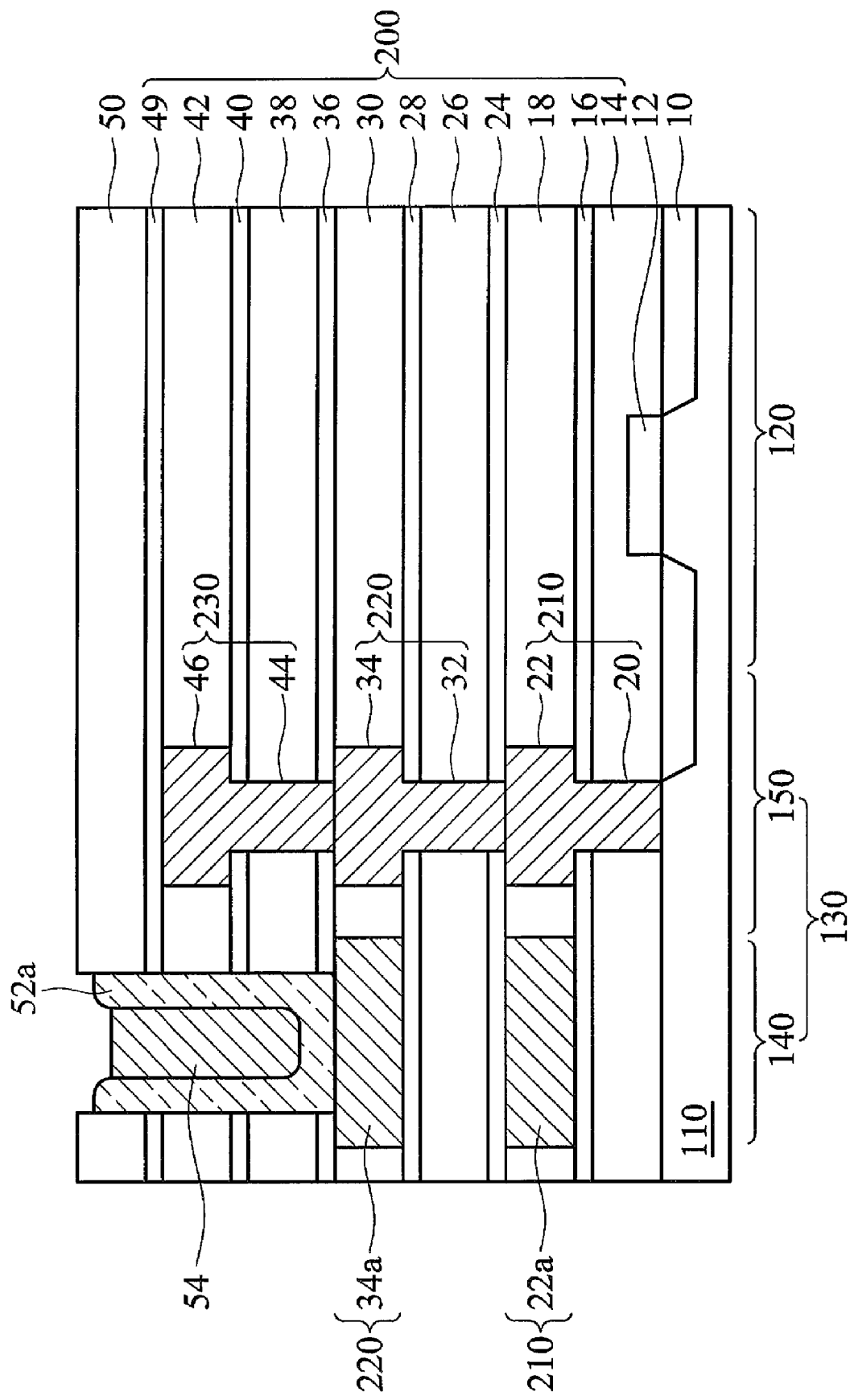
Figure 4F:
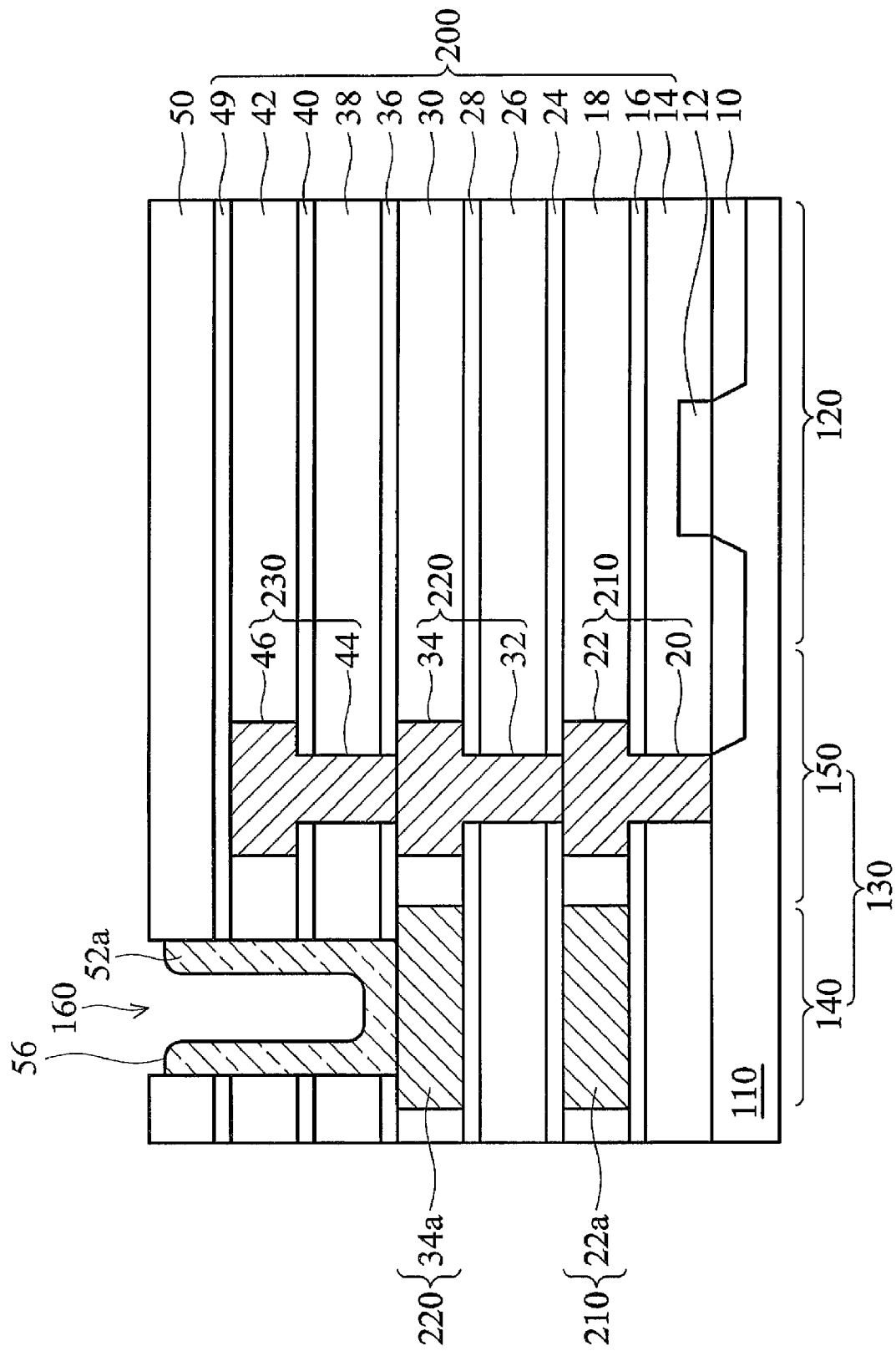

FIG. 4d shows a pad structure 160 formed by a planarization process. First, a sacrificial layer 54 formed over the pad layer and filled the recess 53. The sacrificial layer 54 may comprise photoresist deposited by coating. An etching back process, as shown in FIG. 4e, then forms pad layer 52a. Finally, the sacrificial layer 54 is removed to form the pad structure 160 as shown in FIG. 4f. In some embodiments, a chemical mechanical polishing (CMP) process can be used for removal of part of the pad layer 52. Referring to FIG. 4f, the pad structure 160 is electrically connected to the second metal trench 34a of the lower wiring 220. In some embodiments, the pad structure 160 can be electrically connected to any one of the lower wirings 210 or 220, but is not limited to the W-plug 20, the vias 32 and 44, or the metal trenches 22, 22a, 34, 34a and 46. Preferably the pad structure 160 is an embedded structure; a surface 56 of the pad layer 52a may be substantially coplanar or lower than the passivation layer 50, but preferably the surface 56 of the pad layer 52a is not over the passivation layer 50. Thus, a subsequently formed color filter planarization layer 66 over the passivation layer 50 can be reduced as shown in FIG. 3. Next, a microlens layer 70 may be formed on the color filter planarization layer 66 as shown in FIG. 3.

The embodiment of FIG. 3 provides a pad structure 160 of a semiconductor device 100. Preferably, the pad structure 160 can reduce the thickness of the pad layer 52a, as the surface 56 of pad layer 52a is not over the passivation layer 50. Thus, the thickness of the subsequently formed color filter planarization layer 66 can be reduced. Preferably, the resulting stack height of the pad structure 160 has about 22% reduction in thickness (from 56000 Å to 43000 Å). The disclosed pad structure 160 is capable of preventing reduced light sensitivity and cross talk; thus, performance of the image sensor device may be improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a substrate comprising an image sensor region and a circuit region, wherein the circuit region comprises a pad region and a connecting region;
    a multilayer interconnect structure formed on the substrate, wherein the multilayer interconnect structure comprises a plurality of dielectric layers, a plurality of lower wirings at the pad region and the connecting region, and a top wiring on at least one of the lower wirings at the connecting region;
    a passivation layer formed over the multilayer interconnect structure; and
    a pad structure comprising an opening formed through the passivation layer and at least one of the dielectric layers and a pad layer conformally formed in the opening and on sidewalls of the passivation layer and the dielectric layers, wherein the pad structure is on and electrically connected to at least one of the lower wirings at the pad region.

2. The semiconductor device as claimed in claim 1, wherein the image sensor region comprises an image sensor formed on the substrate.

3. The semiconductor device as claimed in claim 1, wherein the pad structure comprises an opening and a pad layer in the opening.

4. The semiconductor device as claimed in claim 1, wherein a surface of the pad layer is substantially coplanar with the passivation layer.

5. The semiconductor device as claimed in claim 1, wherein a surface of the pad layer is substantially lower than a surface of the passivation layer.

6. The semiconductor device as claimed in claim 1, wherein the pad structure further comprises a planarization layer overlaid the passivation layer and the pad structure.

7. The semiconductor device as claimed in claim 6, wherein the pad structure further comprising a microlens layer forming on the planarization layer.

8. The semiconductor device as claimed in claim 1 made by the process comprising steps:
    providing a substrate comprising an image sensor region and a circuit region, wherein the circuit region comprises a pad region and a connecting region;
    forming a multilayer interconnect structure on the substrate, wherein the multilayer interconnect structure comprises a plurality of dielectric layers, a plurality of lower wirings at the pad region and the connecting region, and a top wiring on at least one of the lower wirings at the connecting region;
    forming a passivation layer over the multilayer interconnect structure; and
    forming a pad structure through the passivation layer and at least one of the dielectric layers on and electrically connected to at least one of the lower wirings at the pad region.

9. A semiconductor device, comprising:
    a substrate comprises an image sensor formed thereon;
    a multilayer interconnect structure formed on the substrate, wherein the multilayer interconnect structure comprises a plurality of lower wirings and a top wiring;
    a passivation layer formed over the multilayer interconnect structure; and
    a pad structure comprising an opening formed through the passivation layer and a pad layer conformally formed in the opening and on sidewalls of the passivation layer, wherein a bottom of the pad layer is not higher than a bottom of the top wiring.

10. The semiconductor device as claimed in claim 9, wherein a surface of the pad layer is substantially coplanar with the passivation layer.

11. The semiconductor device as claimed in claim 9, wherein a surface of the pad layer is substantially lower than a surface of the passivation layer.

12. The semiconductor device as claimed in claim 9, wherein the pad structure is electrically connected to at least one of the lower wirings.

13. The semiconductor device as claimed in claim 9, wherein the pad structure further comprising a microlens layer forming on a planarization layer overlying the passivation layer and the pad layer.

14. The semiconductor device as claimed in claim 9 made by the process comprising steps:
    providing a substrate comprising an image sensor formed thereon;
    forming a multilayer interconnect structure on the substrate, wherein the multilayer interconnect structure comprises a plurality of lower wirings and a top wiring;
    forming a passivation layer over the multilayer interconnect structure;
    forming an opening through the passivation layer, wherein a bottom of the opening is lower than the top wiring; and
    comfortably forming a pad layer in the opening to form a pad structure.

15. A semiconductor device, comprising:
    a substrate comprises an image sensor formed thereon;
    a multilayer interconnect structure formed on the substrate;
    a passivation layer formed over the multilayer interconnect structure; and
    a pad structure comprising an opening formed through the passivation layer and a pad layer conformally formed in the opening and on sidewalls of the passivation layer, wherein a surface of the pad layer is not over the passivation layer, wherein the pad structure is directly electrically connected to a lower wiring of the multilayer interconnect structure.

16. The semiconductor device as claimed in claim 15, wherein the surface of the pad layer is substantially coplanar with the passivation layer.

17. The semiconductor device as claimed in claim 15, wherein the surface of the pad layer is substantially lower than a surface of the passivation layer.

* * * * *